United States Patent
Goto

(10) Patent No.: US 10,466,723 B2
(45) Date of Patent: Nov. 5, 2019

(54) COMPUTING DEVICE AND SAMPLING METHOD

(71) Applicant: KABUSHIKI KAISHA TOSHIBA, Tokyo (JP)

(72) Inventor: Hayato Goto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 328 days.

(21) Appl. No.: 15/443,324

(22) Filed: Feb. 27, 2017

(65) Prior Publication Data

US 2018/0017978 A1  Jan. 18, 2018

(30) Foreign Application Priority Data

Jul. 15, 2016 (JP) ................................ 2016-140497

(51) Int. Cl.
*G05D 19/02* (2006.01)
*G06N 10/00* (2019.01)
(Continued)

(52) U.S. Cl.
CPC .............. *G05D 19/02* (2013.01); *G06N 10/00* (2019.01); *G06N 20/00* (2019.01); *H01L 39/025* (2013.01); *H01L 39/223* (2013.01); *H03B 1/02* (2013.01)

(58) Field of Classification Search
CPC . G01R 29/0871; H01L 39/223; H01L 39/025; H01L 7/26; H03B 27/00;
(Continued)

(56) References Cited

U.S. PATENT DOCUMENTS

2007/0180586 A1  8/2007 Amin
2017/0104493 A1  4/2017 Goto
(Continued)

FOREIGN PATENT DOCUMENTS

JP  4-259118  9/1992
JP  8-12233  11/1994
(Continued)

OTHER PUBLICATIONS

Hinton et al.; "Reducing the Dimensionality of Data With Neural Networks", Science, vol. 313, pp. 504-507, (2006).
(Continued)

*Primary Examiner* — Arnold M Kinkead
(74) *Attorney, Agent, or Firm* — Finnegan, Henderson, Farabow, Garrett & Dunner, L.L.P.

(57) ABSTRACT

A computing device includes an oscillator network and a controller. The oscillator network includes a plurality of oscillators coupled to each other. The controller is configured to control the oscillator network. Each of the oscillators has a nonlinear energy shift. The controller performs a plurality of sampling operations. Each sampling operation includes a first operation of outputting a signal causing the oscillators to stop oscillating, a second operation of outputting a signal causing the oscillators to oscillate based on a parameter relating to a first probability distribution, and a third operation of outputting a signal to measure, for the oscillators, a phase of an electromagnetic wave generated by an oscillation.

20 Claims, 6 Drawing Sheets

(51) Int. Cl.
*G06N 20/00* (2019.01)
*H01L 39/22* (2006.01)
*H01L 39/02* (2006.01)
*H03B 1/02* (2006.01)

(58) Field of Classification Search
CPC ...... H03B 1/02; G06N 99/002; G06N 99/005; G05D 19/02
USPC .............................. 331/2, 46; 977/755, 932
See application file for complete search history.

(56) References Cited

U.S. PATENT DOCUMENTS

2018/0013052 A1* 1/2018 Oliver ................. H01L 25/0657
2018/0308007 A1* 10/2018 Amin ..................... B82Y 10/00

FOREIGN PATENT DOCUMENTS

JP 2009-524857 7/2009
JP 2017-73106 4/2017

OTHER PUBLICATIONS

Adachi et al.; "Application of Quantum Annealing to Training of Deep Neural Networks", arXiv:1510. 06356, pp. 1-18, (2015).
Benedetti et al.; "Estimation of Effective Temperatures in Quantum Annealers for Sampling Applications: A Case Study Towards Deep Learning", arXiv:1510. 07611, pp. 1-13, (2015).
Amin; "Searching for Quantum Speedup in Quasistatic Quantum Annealers", Physical Review A, vol. 92, pp. 052323-1 to 052323-5, (2015).
Goto; "Bifurcation-Based Adiabatic Quantum Computation With a Nonlinear Oscillator Network", Scientific Reports, 6, 21686, pp. 1-8, (2016).
Goto; "Universal Quantum Computation With a Nonlinear Oscillator Network", Physical Review A, vol. 93, pp. 050301-1 to 050301-4, (2016).
Dykman et al.; "Quantum Heating of a Parametrically Modulated Oscillator: Special Signatures", Physical Review A, vol. 83, pp. 052115-1 to 052115-10, (2011).

* cited by examiner

COMPUTING DEVICE AND SAMPLING METHOD

CROSS-REFERENCE TO RELATED APPLICATIONS

This application is based upon and claims the benefit of priority from Japanese Patent Application No. 2016-140497, filed on Jul. 15, 2016; the entire contents of which are incorporated herein by reference.

FIELD

Embodiments described herein relate generally to a computing device and a sampling method.

BACKGROUND

For example, sampling (Gibbs sampling) according to the Boltzmann distribution is performed in Boltzmann machine learning used in artificial intelligence. For example, a quantum annealing machine that solves combinatorial optimization problems by utilizing quantum mechanics is utilized as a computing device performing Gibbs sampling. A novel computing device that can perform sampling is desirable.

DETAILED DESCRIPTION

According to one embodiment, a computing device includes an oscillator network and a controller. The oscillator network includes a plurality of oscillators coupled to each other. The controller is configured to control the oscillator network. Each of the oscillators has a nonlinear energy shift. The controller performs a plurality of sampling operations. Each sampling operation includes a first operation of outputting a signal causing the oscillators to stop oscillating, a second operation of outputting a signal causing the oscillators to oscillate based on a parameter relating to a first probability distribution, and a third operation of outputting a signal to measure, for the oscillators, a phase of an electromagnetic wave generated by an oscillation.

According to one embodiment, a sampling method is disclosed. The sampling method implements sampling processing by using an oscillator network including a plurality of oscillators coupled to each other. Each of the oscillators has a nonlinear energy shift. The sampling processing includes initialization processing of causing the oscillators to stop oscillating, oscillation processing of causing the oscillators to oscillate based on a parameter relating to a first probability distribution, and measurement processing of measuring, for the oscillators, a phase of an electromagnetic wave generated by the oscillation.

Figure 1:
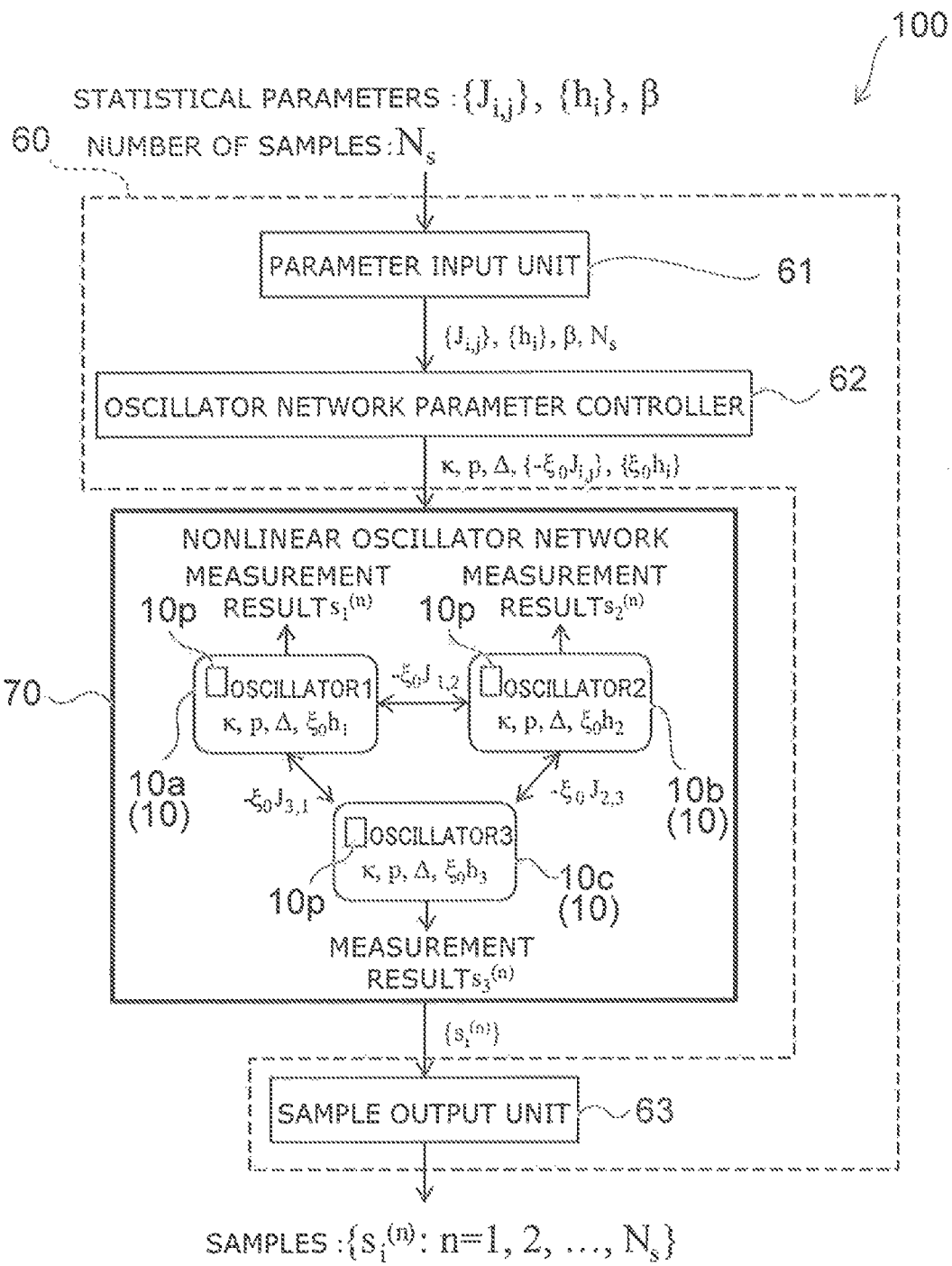
FIG. 1 is a block diagram illustrating a computing device according to an embodiment.

FIG. 1 is a block diagram illustrating a computing device according to an embodiment.

As shown in FIG. 1, the computing device 100 according to the embodiment includes a controller 60 and an oscillator network 70. The computing device 100 is, for example, a quantum Gibbs sampler (a Gibbs sampler utilizing quantum mechanics) outputting a sample corresponding to a designated probability distribution.

The controller 60 controls the operations of the oscillator network 70. As shown in FIG. 1, the controller 60 includes a parameter input unit 61, an oscillator network parameter controller 62, and a sample output unit 63.

At least a portion of the controller 60 may include, for example, an integrated circuit such as LSI (Large Scale Integration), etc. At least a portion of the controller 60 may include, for example, an IC (Integrated Circuit) chipset. The controller 60 may include a general-purpose processor. Circuits that correspond respectively to multiple blocks included in the controller 60 may be used. A circuit may be used in which at least a portion of the blocks included in the controller 60 are integrated. One block may include multiple circuits. The multiple blocks included in the controller 60 may be provided as one body.

For example, at least one of the parameter input unit 61 or the sample output unit 63 may be an input/output terminal. At least one of the parameter input unit 61 or the sample output unit 63 may be an input/output interface. Wired or wireless communication with the outside is possible via the input/output interface.

The oscillator network 70 includes multiple oscillators 10 that are coupled to each other. In the example of FIG. 1, the oscillator network 70 includes three oscillators 10 (an oscillator 10a, an oscillator 10b, and an oscillator 10c). In the embodiment, the number of the oscillators 10 included in the oscillator network 70 is any integer of 2 or more.

For example, the oscillator 10 has a nonlinear energy shift (a nonlinearity). For example, the energy inside the oscillator 10 shifts as a nonlinear function of the number of photons inside the oscillator 10. A parametric oscillation is generated in the oscillator 10 by modulating a parameter of the oscillator 10. The oscillator 10 includes a parameter modulation portion 10p (e.g., a first electromagnetic wave application portion 11 described below) that causes the oscillator 10 to oscillate by modulating the parameter of the oscillator 10. The oscillator 10 is, for example, a superconducting circuit including a Josephson junction.

Such a nonlinear oscillator network can be utilized to solve a combinatorial optimization problem by using a quantum adiabatic change if the losses can be ignored (Sci. Rep. 6, 21686 (2016)). The nonlinear oscillator network also can be utilized as an universal quantum computer by using quantum gate operations (Phys. Rev. A 93, 050301 (R) (2016)). In such cases, the loss of the oscillator is set to be as small as possible.

In the computing device 100 according to the embodiment, a loss of energy is provided to each of the oscillators 10 when the multiple oscillators 10 oscillate. Here, the provided loss is taken to be sufficiently small to realize the quantum properties of the oscillator. By using nonlinear oscillators having such losses in a network, Gibbs sampling which also can be utilized in Boltzmann machine learning is performed.

A quantum annealing machine realizes Gibbs sampling by utilizing a thermodynamic equilibrium state. Conversely, the computing device 100 (the oscillator network 70) according to the embodiment reaches a nonequilibrium steady state by relaxation due to controllable losses of the oscillators 10. The Gibbs sampling is performed thereby.

When one nonlinear oscillator reaches a nonequilibrium steady state by relaxation due to a small loss, the oscillation state follows the Boltzmann distribution. The relaxation process is called "quantum heating." The effective temperature is called the "quantum temperature" (M. I. Dykman et al., Phys. Rev. A 83, 052115 (2011)). In the embodiment, this quantum effect is extended to the oscillator network. Thereby, Gibbs sampling which also can be utilized in Boltzmann machine learning is possible.

In the computing device 100 as described below, the quantum temperature can be controlled more easily by the parameter of the oscillator 10. Therefore, in the computing device 100, the reliability and the controllability are high compared to, for example, a quantum annealing machine using a thermodynamic equilibrium state.

Figure 2:
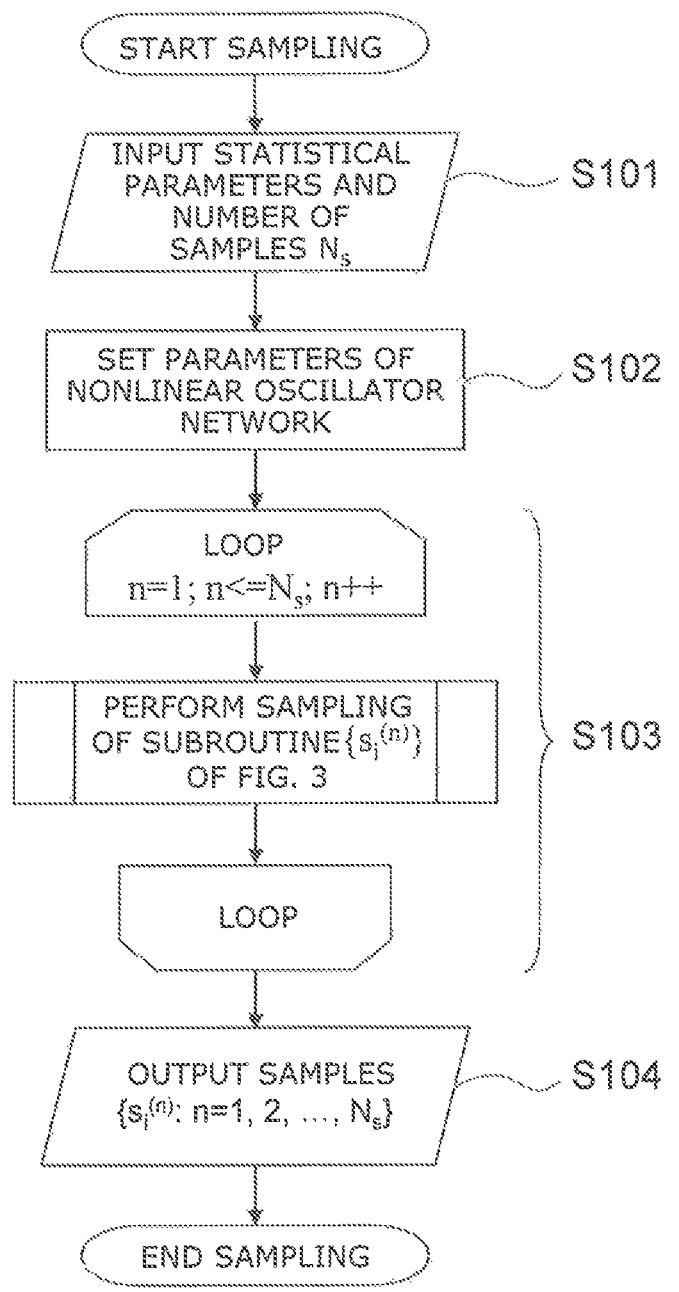
FIG. 2 is a flowchart illustrating the sampling method of the computing device according to the embodiment.
Figure 3:
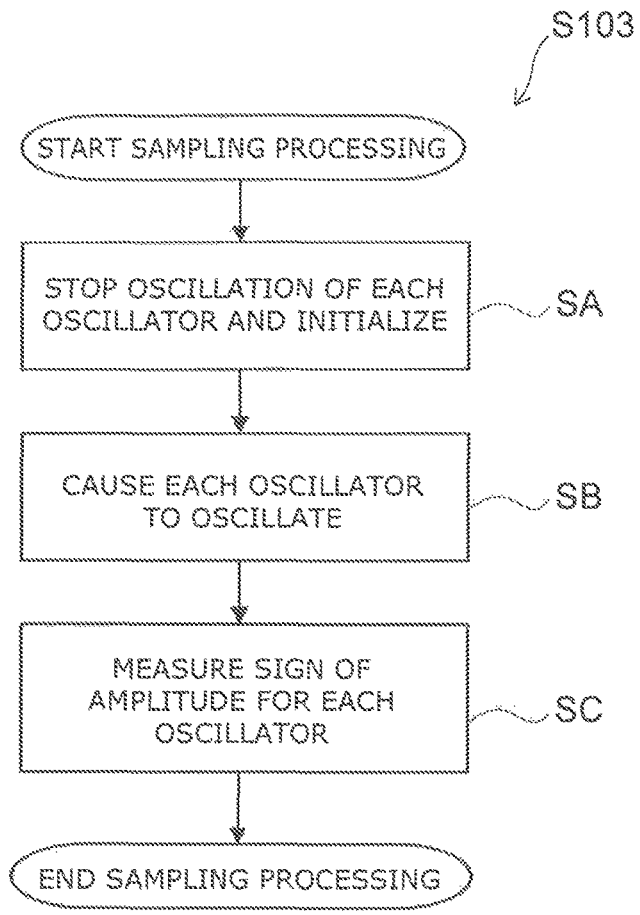
FIG. 3 is a flowchart illustrating the sampling method of the computing device according to the embodiment.

FIG. 2 and FIG. 3 are flowcharts illustrating the sampling method of the computing device according to the embodiment.

In step S101 as shown in FIG. 2, the controller 60 acquires the statistical parameters and the number of samples $N_s$. The statistical parameters ($\{J_{i,j}\}$, $\{h_i\}$, and $\beta$) and the number of samples ($N_s$) are input to the parameter input unit 61. The statistical parameters are parameters that designate the probability distribution (a first probability distribution) to be sampled. Details of the statistical parameters are described below. The number of samples ($N_s$) corresponds to the number of times the sampling processing described below is implemented.

In step S102, the oscillator network parameter controller 62 calculates (sets) the parameters ($\kappa$, $\rho$, $\Delta$, $\{-\xi_0 J_{i,j}\}$, and $\{\xi_0 h_i\}$) of the oscillator network 70 based on the statistical parameters input to the parameter input unit 61. The parameters of the oscillator network 70 are parameters that control the oscillations of the multiple oscillators 10. The details of the parameters of the oscillator network 70 are described below.

In step S103, the oscillator network parameter controller 62 performs the subroutine $N_s$ times (a sampling operation).

FIG. 3 shows the subroutine (the sampling processing) of step S103. One sampling processing includes step SA (initialization processing), step SB (oscillation processing), and step SC (measurement processing).

In step SA, the controller 60 outputs a signal causing the multiple oscillators 10 to stop oscillating (a first operation). In step SB, the controller 60 outputs a signal causing the multiple oscillators 10 to oscillate (a second operation). The signals are based on the parameters of the oscillator network 70 determined from the statistical parameters. In step SC, the controller 60 measures electromagnetic waves generated by the oscillations of the multiple oscillators 10 (a third operation). In other words, the controller 60 outputs a signal to measure the electromagnetic waves (a signal that causes the measuring device to measure the electromagnetic waves).

For example, the phase of the electromagnetic wave is measured for each of the multiple oscillators 10. The states of the multiple oscillators 10 are the quantum-mechanical superimposition of two oscillation states having reverse signs. The two oscillation states that have the reverse signs correspond to Ising spins of ±1. +1 or −1 (the sign of the amplitude of the electromagnetic wave) is obtained as the measurement result $\{s_i\}$ according to the two ranges of 180° each for the measured phases. The value of $s_i$ is the sign of the amplitude of the electromagnetic wave of the ith oscillator 10. One sample ($\{s_i\}$) obtained by one sampling processing is a set of $N_{spin}$ values (+1 or −1), where $N_{spin}$ is the number of the oscillators 10.

In step S104 as shown in FIG. 2, the sample output unit 63 collectively outputs, to the outside, $N_s$ ($N_s$ sets of) samples $\{s_i^{(n)}: n=1, 2, \ldots, N_s\}$ obtained by the sampling processing of $N_s$ times. For example, it is also possible to output the measurement result in step SC for each measurement.

As described above, the computing device 100 according to the embodiment can output the samples corresponding to the designated probability distribution by performing the sampling operation multiple times.

As described above, the computing device 100 according to the embodiment reaches a nonequilibrium steady state by the relaxation due to the losses of the oscillators 10. Thereby, Gibbs sampling can be performed.

On the other hand, if the time that the oscillators 10 oscillate is too short for the speed of the relaxation due to the losses of the oscillators 10, it is difficult for the oscillator 10 to reach the nonequilibrium steady state.

Conversely, in the embodiment, $\kappa > 1/(T_s \times n_{max} \times N_{spin})$ is satisfied. $T_s$ (seconds) is the time necessary for one of the sampling operations. $n_{max}$ is the maximum value of the average number of photons of one of the multiple oscillators 10 within the time of the one of the sampling operations. K (hertz) is the relaxation rate of one of the multiple oscillators 10 in the one of the sampling operations. $N_{spin}$ is the number of the multiple oscillators 10 (the number of all Ising spins described below). The average number of photons is the number of photons per one of the multiple oscillators 10.

For example, the oscillator 10 has nonlinearity called the Kerr effect. Therefore, the energy inside the oscillator 10 shifts, according to a nonlinear function of the number of photons inside the oscillator 10, from the energy proportional to the number of photons of the oscillator 10. In the embodiment, the loss that is provided to the oscillator 10 is set to be sufficiently small to realize quantum properties. For example, K is less than the value of the nonlinear energy shift divided by Planck's constant.

Figure 4:
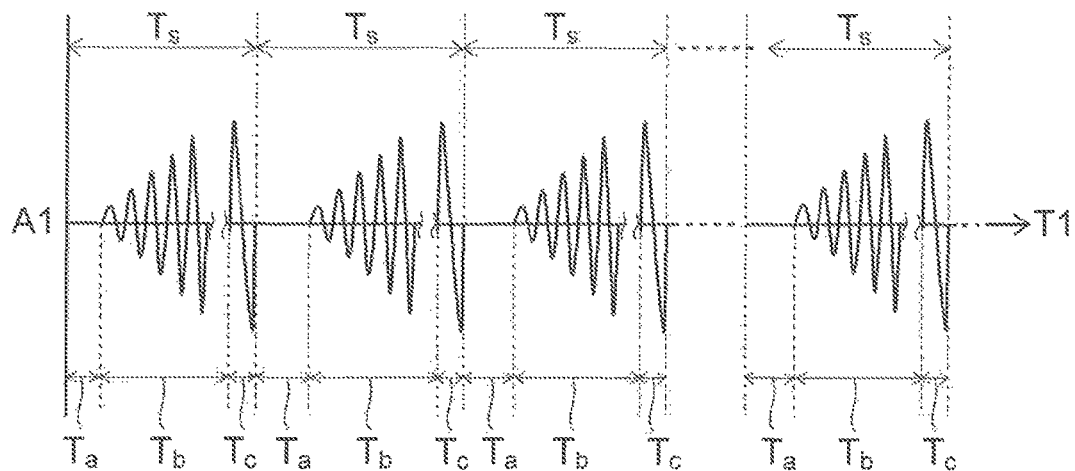
FIG. 4 is a graph illustrating operations of the computing device according to the embodiment.

FIG. 4 is a graph illustrating operations of the computing device according to the embodiment.

FIG. 4 is a conceptual view illustrating the oscillation of one oscillator 10 for the sampling operation of multiple times. The horizontal axis is a time T1; and the vertical axis is an amplitude A1.

The time ($T_s$) of one of the sampling operations includes, for example, a time ($T_a$) for performing the initialization processing, a time ($T_b$) for performing the oscillation processing, and a time ($T_c$) for performing the measurement processing. For example, the time ($T_s$) of one of the sampling operations is from the time when the oscillation of the oscillator 10 is stopped to the time when the oscillation of the oscillator 10 is stopped again. The time for performing the measurement processing may be included in the time for performing the oscillation processing.

The computing device according to the embodiment and the numerical simulation results of the computing device according to the embodiment will now be described. In the example, four oscillators 10 are used.

Considering an application to a Boltzmann machine, a dimensionless quantity of energy is defined as follows.

$$E(s_1, s_2, s_3, s_4) = -\frac{1}{2}\sum_{i=1}^{4}\sum_{j=1}^{4} J_{i,j} s_i s_j + \sum_{i=1}^{4} h_i s_i \quad \text{[Formula 1]}$$

Instead of a bit (0, 1), a variable (Ising spin) $\{s_i\}$ that can be ±1 is used; and the same form as the Ising model is used.

$\{h_i\}$ is a constant representing the external field of each of the Ising spins.

$\{J_{i,j}\}$ is a constant representing the interaction between the Ising spins. $\{J_{i,j}\}$ satisfies the following formula.

$$J_{i,i}=0, \; J_{i,j}=J_{j,i} \quad \text{[Formula 2]}$$

The Boltzmann distribution provides the probability of each spin configuration by the following formula.

$$P(s_1, s_2, s_3, s_4) = \frac{e^{-\beta E(s_1,s_2,s_3,s_4)}}{Z} \quad \text{[Formula 3]}$$

β is the reciprocal of the temperature (setting the Boltzmann constant to 1) and is called the inverse temperature.

Z is a normalization factor called the partition function. Z is provided by the following formula.

$$Z = \sum_{s_1,s_2,s_3,s_4} e^{-\beta E(s_1,s_2,s_3,s_4)} \quad \text{[Formula 4]}$$

In the numerical simulation, $\{J_{i,j}\}$ and $\{h_i\}$ are selected as follows as uniform random numbers not smaller than −1 and not larger than +1.

$J_{1,2}=-0.532778$ $J_{1,3}=0.814437$ $J_{1,4}=-0.931225$ $J_{2,3}=0.02004$ $J_{2,4}=0.160178$ $J_{3,4}=0.223692$ [Formula 5]

$h_1=-0.741771$ $h_2=-0.605853$ $h_3=0.372483$ $h_4=-0.355546$ [Formula 6]

Simulation results that are similar to those recited below are obtained even in the case where values other than the values of $\{J_{i,j}\}$ and the values of $\{h_i\}$ recited above are used.

To perform sampling of the Boltzmann distribution, in the computing device 100 according to the embodiment, the oscillator network 70 is set as follows. First, the Hamiltonian of the system when there are no losses is as follows (Sci. Rep. 6, 21686 (2016)).

$$H(t) = \hbar\sum_{i=1}^{4}\left[\frac{K}{2}a_i^{\dagger 2}a_i^2 - \frac{p(t)}{2}(a_i^{\dagger 2}+a_i^2) + \Delta a_i^{\dagger}a_i\right] + \\ \hbar\xi_0\left[-\sum_{i=1}^{4}\sum_{j=1}^{4} J_{i,j} a_i^{\dagger} a_j + \sum_{i=1}^{4} h_i(a_i^{\dagger}+a_i)\right] \quad \text{[Formula 7]}$$

The first term relates to each of the oscillators 10. "K" is the Kerr coefficient of a nonlinear effect (an example of the nonlinearity recited above) called the Kerr effect. p(t) is the pump amplitude of the parametric excitation. Δ is the detuning of the resonance angular frequency of the oscillator from the half value of the parametric excitation frequency (in the detuning, $\Delta=\omega-(\omega_p/2)$, where ω is the resonance angular frequency of the oscillator 10, and $\omega_p$ is the pump frequency of the parametric excitation). Information of the provided Boltzmann distribution is included in the second term. $\xi_0$ is a constant having the dimensions of the frequency.

For example, the case is considered where the initial states of all of the oscillators 10 are set to the vacuum state; and the oscillators 10 are caused to oscillate by increasing p(t) sufficiently slowly from zero. At this time, if there are no losses, the ground state is obtained according to the quantum adiabatic change. The ground state of the Ising model can be obtained by associating the sign of the amplitude of the oscillation state with the Ising spin (Sci. Rep. 6, 21686 (2016)).

In the computing device 100 according to the embodiment, losses are provided deliberately to each of the oscillators 10. At this time, the time evolution equation of the density operator p(t) that describes the state of the system is provided by the following master equation.

$$\frac{d\rho}{dt} = -\frac{i}{\hbar}[H(t), \rho(t)] + \kappa\sum_{i=1}^{4}\left(2a_i\rho(t)a_i^{\dagger} - a_i^{\dagger}a_i\rho(t) - \rho(t)a_i^{\dagger}a_i\right) \quad \text{[Formula 8]}$$

The second term illustrates the relaxation due to the loss; and κ is the relaxation rate of the relaxation.

Thus, in the case where there are losses, the oscillators 10 are caused to oscillate by setting p(t) to be not smaller than the threshold. In such a case, the probability distribution becomes the Boltzmann distribution recited above by associating the sign of the amplitude of the oscillation state with the Ising spin. The results of the numerical simulation are shown below.

Figure 5:
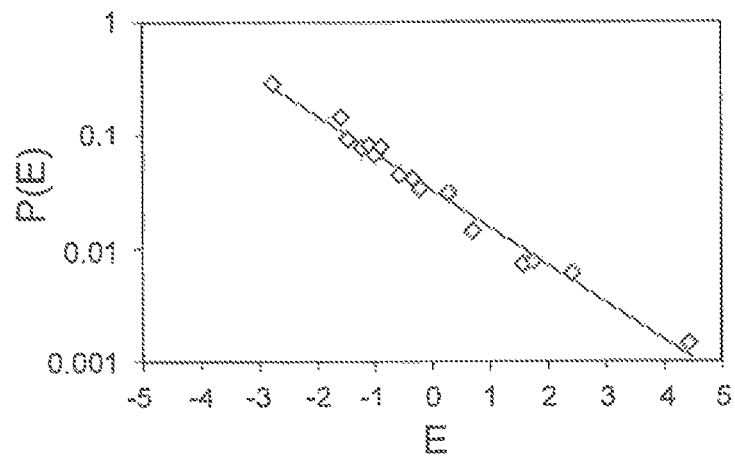
FIG. 5 is a graph illustrating the numerical simulation results of the computing device according to the embodiment.
Figure 6:
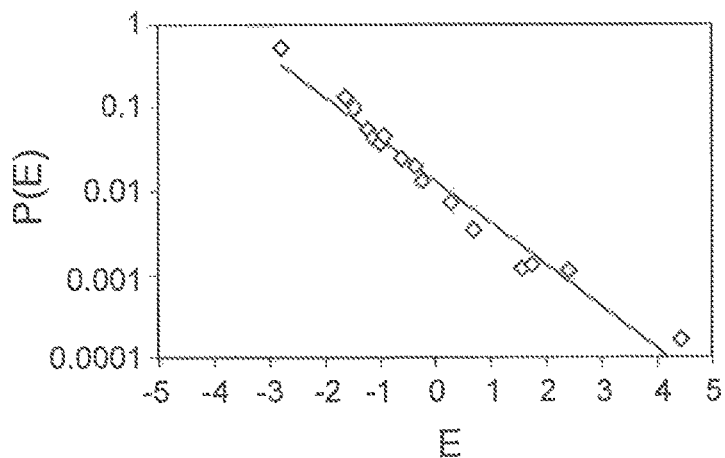
FIG. 6 is a graph illustrating the numerical simulation results of the computing device according to the embodiment.
Figure 7:
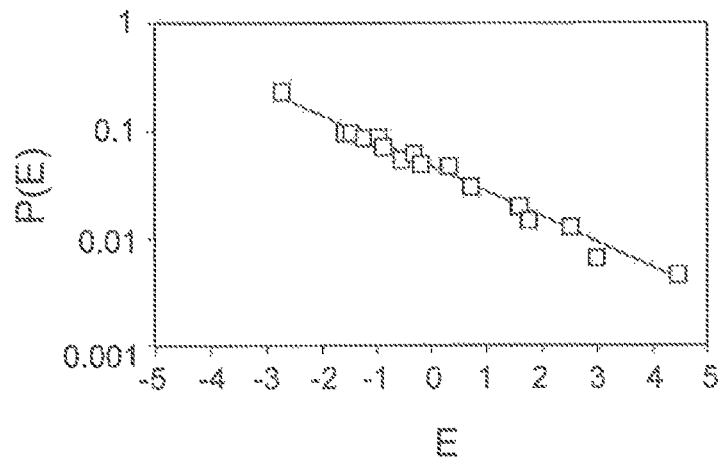
FIG. 7 is a graph illustrating the numerical simulation results of the computing device according to the embodiment.

FIG. 5 to FIG. 7 are graphs illustrating the numerical simulation results of the computing device according to the embodiment.

A quantum trajectory simulation method is used to numerically solve the master equation. The probability of each spin configuration is calculated using the average of the trajectories of 100 times. The values of the parameters are as follows. The units of "K" are the units of the frequency; and K=1. Δ=1, $\xi_0$=0.2, κ=0.01, and p(t)=3 tan h(−t/500) are used. The calculations are performed in the range of t=0 to 500. FIG. 5 illustrates the probability distribution at the final time t=500.

The horizontal axis of FIG. 5 illustrates an energy E. The vertical axis of FIG. 5 illustrates the probability P(E). FIG. 5 is a semilog graph; and the scale of the vertical axis is a logarithmic scale. In FIG. 5, the points that show the relationship between the probability P(E) and the energy E are plotted on a straight line. In other words, the probability P(E) follows the Boltzmann distribution. The inverse temperature corresponds to the slope of the straight line. The straight line of FIG. 5 is the result of fitting $e^{-\beta E}/Z$ using $\beta$ and Z as fitting parameters. $\beta=0.756$ is determined from the fitting.

FIG. 6 and FIG. 7 show simulation results in the case where A and p(t) are modified in the simulation shown in FIG. 5. In the example of FIG. 6, $\Delta=0.5$ and p(t)=2.5 tan h(−t/500). In the example of FIG. 7, $\Delta=1.5$ and p(t)=3.5 tan h(−t/500). In either graph, it can be seen that the probability P(E) follows the Boltzmann distribution because the relationship between the probability P(E) and the energy E is linear.

On the other hand, for the inverse temperature, $\beta=1.15$ in FIG. 6; and $\beta=0.537$ in FIG. 7. Thus, the inverse temperature can be controlled easily by controlling the adjustable parameters of the system such as the detuning, the pump amplitude, etc.

In the simulations described above, the pump amplitude is increased from zero to be the threshold or more; and the oscillation state was measured at the final time. When the computing device 100 is utilized in the sampling, multiple samples are obtained by repeating such a measurement. After one sample is measured, the oscillation is stopped (the initialization processing) by reducing the pump amplitude once to be the threshold or less, etc. Subsequently, the pump amplitude again is increased, etc., to cause the oscillators 10 to oscillate (the oscillation processing); and the oscillation state is measured (the measurement processing). The initialization, the oscillation, and the measurement are repeated in the sampling. Thereby, a sample is obtained that is independent of the previous samples.

As described above, the computing device 100 performs Gibbs sampling by utilizing a nonequilibrium steady state reached by the relaxation due to the losses of the oscillators 10. Therefore, the relaxation rate K when sampling is larger than at least $1/(T_s n_{max} N_{spin})$, i.e., the reciprocal of the product of the time $T_s$ necessary for one sampling (the initialization of stopping the oscillations, the re-oscillations, and the measurement of the oscillation states), the maximum value $n_{max}$ of the average number of photons inside the oscillator in the sampling, and the total Ising spin count $N_{spin}$.

An example of the computing device 100 will now be described.

Figure 8:
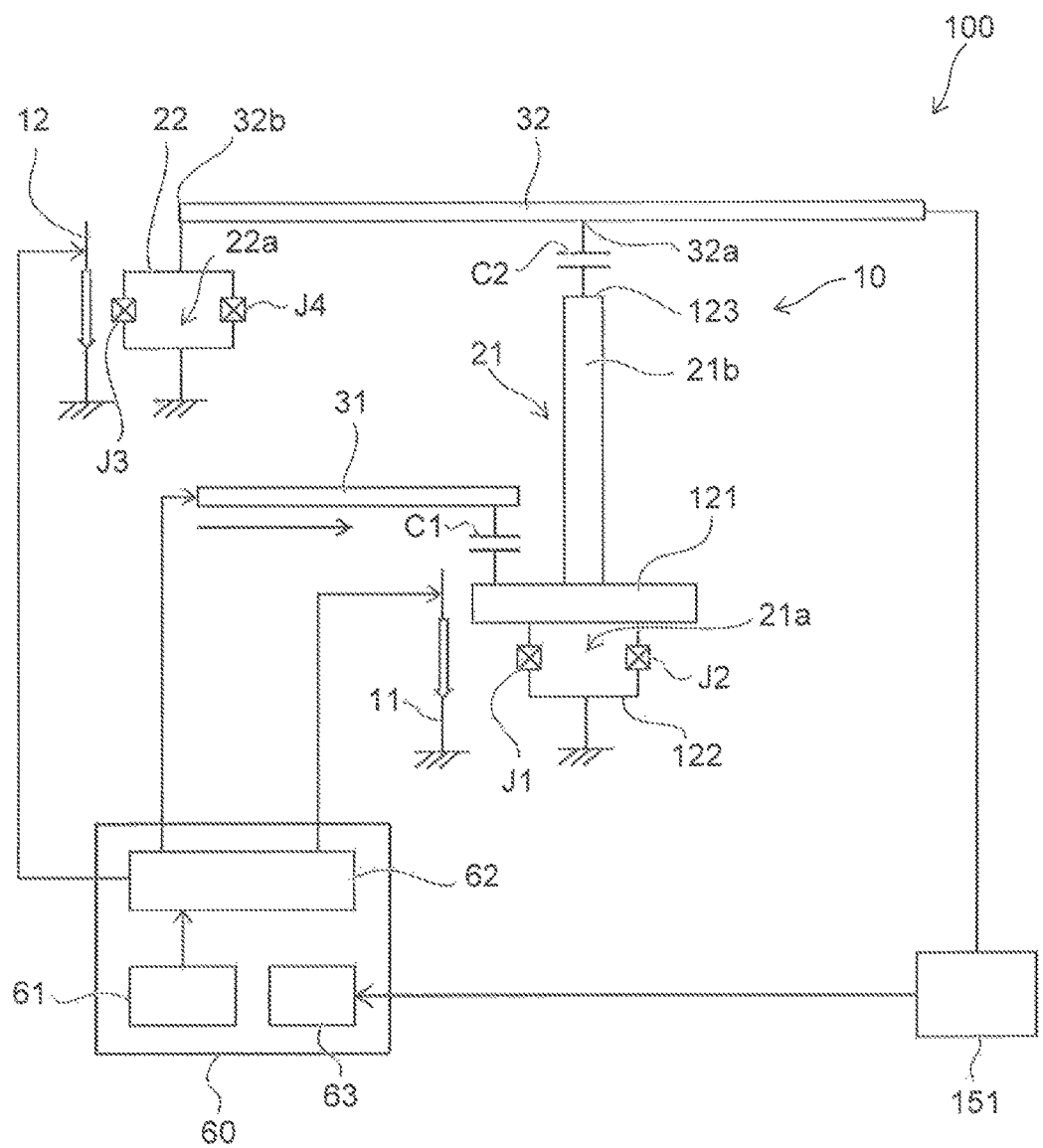
FIG. 8 is a schematic view illustrating portions of the computing device according to the embodiment.
Figure 9:
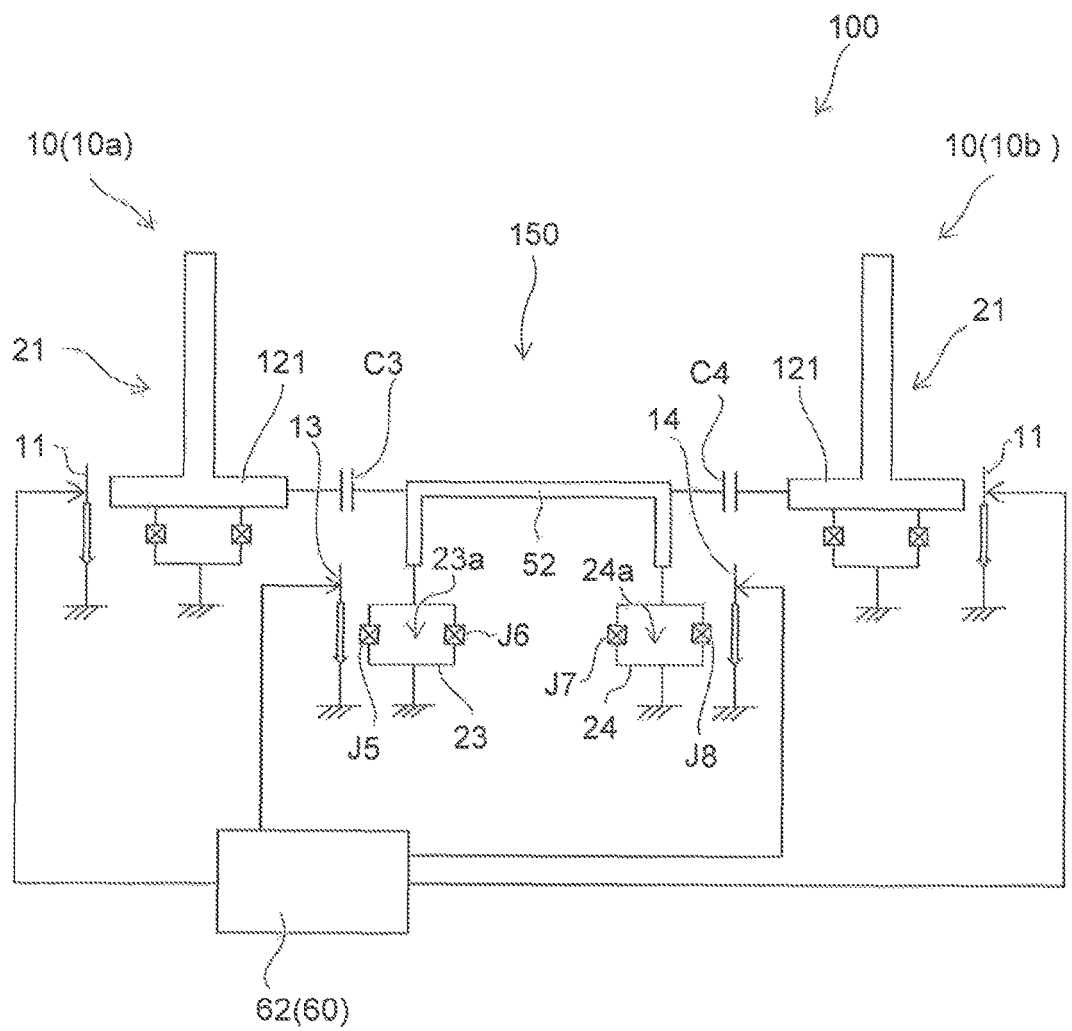
FIG. 9 is a schematic view illustrating portions of the computing device according to the embodiment.

FIG. 8 and FIG. 9 are schematic views illustrating portions of the computing device according to the embodiment.

FIG. 8 schematically illustrates one of the multiple oscillators 10 and the periphery of the one of the multiple oscillators 10 by using a circuit diagram.

As shown in FIG. 8, the oscillator 10 includes the first electromagnetic wave application portion 11, a first resonator 21, and a first conductive portion 31. The computing device 100 includes a second electromagnetic wave application portion 12, a second resonator 22, and a second conductive portion 32.

The first resonator 21 is a superconducting nonlinear resonator including Josephson junctions. The first resonator 21 has a dc SQUID (superconducting quantum interference device) structure and includes a superconducting portion 121 and a superconducting portion 122 that are connected to each other. In other words, the first resonator 21 includes a loop (a ring) 21a provided by the superconducting portions 121 and 122. The superconducting portion 121 and the superconducting portion 122 are connected to each other by Josephson junctions J1 and J2. For example, an insulating body is provided between one end of the superconducting portion 121 and one end of the superconducting portion 122; and an insulating body is provided between another end of the superconducting portion 121 and another end of the superconducting portion 122. Thereby, the loop 21a is provided.

The center of the first resonator 21 is used as a waveguide 21b. In other words, the superconducting portion 121 includes the waveguide 21b extending from an end of the loop 21a toward the outer side of the loop 21a.

In the dc SQUID structure, it is possible to control the Josephson energy due to the Josephson junction by the flux inside the dc SQUID. The first resonator 21 can oscillate according to the change of the flux inside the loop 21a.

The first electromagnetic wave application portion 11 applies an electromagnetic wave to the first resonator 21. An external current for exciting the oscillation modes of the dc SQUID (an external current for exciting the dc SQUID) flows in the first electromagnetic wave application portion 11. A varying magnetic field is generated by a high frequency current flowing in the first electromagnetic wave application portion 11. Thereby, the first electromagnetic wave application portion 11 controls the flux inside the dc SQUID (inside the loop 21a).

The first conductive portion 31 is a conductive portion that has a capacitive coupling with the first resonator 21 (the superconducting portion 121) via a capacitor C1.

The second conductive portion 32 has a capacitive coupling with the first resonator 21 (the waveguide 21b) via a capacitor C2. A portion 32a of the second conductive portion 32 and an end portion 123 of the waveguide 21b are arranged to oppose each other. The second conductive portion 32 transmits the electromagnetic wave generated by the oscillation of the first resonator 21. For example, the second conductive portion 32 is a read line and is electrically connected to a measuring device 151. Thereby, the electromagnetic wave that propagates from the first resonator 21 can be measured. The controller 60 acquires the measurement results of the measuring device 151. The measuring device 151 may be a portion of the controller 60.

Another portion 32b of the second conductive portion 32 is electrically connected to the second resonator 22. Similarly to the first resonator 21, the second resonator 22 has a dc SQUID structure. The second resonator 22 is a superconducting circuit that includes a loop 22a including two Josephson junctions J3 and J4.

The second electromagnetic wave application portion 12 applies an electromagnetic wave to the second resonator 22. A varying magnetic field is generated by an external current (an external current for exciting the dc SQUID) flowing in the second electromagnetic wave application portion 12. Thereby, the second electromagnetic wave application portion 12 can control the flux inside the loop 22a of the second resonator 22.

The controller 60 (the oscillator network parameter controller 62) controls the oscillation of the first resonator 21 by controlling the operations of the first conductive portion 31 and the first electromagnetic wave application portion 11.

For example, the controller 60 controls the external current flowing through the first electromagnetic wave application portion 11. Thereby, the controller 60 controls the detuning A of the oscillator 10 by controlling the DC component of the flux inside the dc SQUID of the first resonator 21. The controller 60 controls the pump amplitude p of the parametric excitation by high frequency modulation (at a frequency of about 2 times the resonant frequency of the resonator) of the flux inside the dc SQUID of the first resonator 21.

The controller 60 controls $\xi_0 h$ by external excitation (an electromagnetic wave of a frequency of the half value of the parametric excitation frequency) by controlling the electromagnetic wave transmitted through the first conductive portion 31.

The controller 60 (the oscillator network parameter controller 62) controls the relaxation rate (K) of the oscillator 10 by controlling the operation of the second electromagnetic wave application portion 12. For example, the controller 60 controls the external current flowing through the second electromagnetic wave application portion 12. Thereby, the controller 60 controls the coupling strength between the first resonator 21 and the second conductive portion 32 by controlling the flux inside the dc SQUID of the second resonator 22. Thereby, the relaxation rate ($\kappa$) of the oscillator 10 can be controlled.

For example, in a conventional quantum computer, the relaxation rate ($\kappa$) is set to zero when calculating, and is set when reading to be larger than when calculating. Conversely, in the computing device 100 according to the embodiment, the relaxation rate ($\kappa$) is set to an appropriate value that is nonzero in the sampling.

For example, one oscillator 10 is caused to oscillate to be similar to the oscillation state in the sampling operation; and the electromagnetic wave that is generated by the oscillation of the oscillator 10 at this time is measured. The average number of photons inside the oscillator 10 in the sampling operation can be estimated from the energy of the electromagnetic wave. The oscillation is stopped at some time; and the relaxation rate ($\kappa$) of the oscillator 10 in the sampling operation can be estimated from the subsequent temporal change of the average number of photons.

For example, the oscillator 10, the second conductive portion 32, etc., are interconnects provided on a substrate. These interconnects include, for example, aluminum (Al), niobium (Nb), etc., and transition to superconductors by cooling. A conductive film (not illustrated) that surrounds the interconnects recited above is provided on the substrate; and the conductive film is connected to the ground potential. Interconnects are not provided between the first conductive portion 31 and the first resonator 21 and between the second conductive portion 32 and the first resonator 21. Thereby, the capacitors C1 and C2 are formed; and the first resonator 21 has capacitive coupling with the first conductive portion 31 and the second conductive portion 32.

FIG. 9 schematically illustrates an example of the coupling of two oscillators 10 (the oscillators 10a and 10b) using a circuit diagram.

As shown in FIG. 9, the computing device 100 includes a coupling resonator 150. The two oscillators 10 are coupled via the coupling resonator 150.

The coupling resonator 150 includes an interconnect portion 52 (the superconducting portion), a third resonator 23, a third electromagnetic wave application portion 13, a fourth resonator 24, and a fourth electromagnetic wave application portion 14. The interconnect portion 52 is a waveguide.

The third resonator 23 and the fourth resonator 24 each have dc SQUID structures. The third resonator 23 is a superconducting circuit including a loop 23a including two Josephson junctions J5 and J6. The fourth resonator 24 is a superconducting circuit including a loop 24a including two Josephson junctions J7 and J8. In the circuit, the third resonator 23 is provided between the ground potential and one end of the interconnect portion 52; and the fourth resonator 24 is provided between the ground potential and another end of the interconnect portion 52.

The third electromagnetic wave application portion 13 applies an electromagnetic wave to the third resonator 23. The third electromagnetic wave application portion 13 can modulate the flux inside the third resonator 23 (the loop of the dc SQUID) by generating a varying magnetic field by an external current flowing through the third electromagnetic wave application portion 13. Similarly, the fourth electromagnetic wave application portion 14 applies an electromagnetic wave to the fourth resonator 24. The fourth electromagnetic wave application portion 14 can modulate the flux inside the fourth resonator 24 (the loop of the dc SQUID) by generating a varying magnetic field by an external current flowing through the fourth electromagnetic wave application portion 14.

The superconducting portion 121 of the oscillator 10a is capacitively coupled to the interconnect portion 52 of the coupling resonator 150 by a capacitor C3. Similarly, the superconducting portion 121 of the oscillator 10b is capacitively coupled to the interconnect portion 52 of the coupling resonator 150 by a capacitor C4.

Thus, in the computing device 100 according to the embodiment, each of the multiple oscillators 10 has capacitive coupling with a coupling resonator terminated with dc SQUIDs. The oscillators 10 are coupled to each other via the coupling resonator; and a network of the oscillators 10 is formed.

The controller 60 (the oscillator network parameter controller 62) controls the coupling between the oscillator 10a and the oscillator 10b by controlling the operations of the third electromagnetic wave application portion 13 and the fourth electromagnetic wave application portion 14. In other words, the controller 60 controls the coupling coefficient ($-\xi_0 J$) of the two oscillators (10a and 10b) by controlling the flux inside the third resonator 23 and the flux inside the fourth resonator 24 using the external current.

Although the case is illustrated in FIG. 9 where two oscillators 10 are coupled, three or more oscillators 10 may be provided in the embodiment. In such a case, it is sufficient to increase the number of arms of the oscillators 10 and to provide the coupling resonators 150 between the multiple oscillators 10.

The embodiments include, for example, the following configurations.

(Configuration 1) A computing device, comprising:
an oscillator network including a plurality of oscillators coupled to each other; and
a controller configured to control the oscillator network, each of the oscillators having a nonlinear energy shift, the controller performing a plurality of sampling operations, each sampling operation including
a first operation of outputting a signal causing the oscillators to stop oscillating, a second operation of outputting a signal causing the oscillators to oscillate based on a parameter relating to a
first probability distribution, and a third operation of outputting a signal to measure, for the oscillators, a phase of an electromagnetic wave
generated by an oscillation.

(Configuration 2) The device according to configuration 1, wherein each of the oscillators is a resonator including a Josephson junction.

(Configuration 3) The device according to configuration 1 or 2, wherein each of the oscillators includes a parameter modulation portion configured to cause the oscillator to oscillate by modulating a parameter of the oscillator.

(Configuration 4) The device according to one of configurations 1 to 3, wherein $\kappa$, $T_s$, $n_{max}$, and $N_{spin}$ satisfy $\kappa > 1/(T_s \times n_{max} \times N_{spin})$, where $T_s$ is a time of one of the sampling operations, $n_{max}$ is a maximum value of an average number of photons of one of the oscillators within the time of the sampling operation, $\kappa$ is a relaxation rate of the one of the oscillators, and $N_{spin}$ is the number of the oscillators.

(Configuration 5) The device according to one of configurations 1 to 4, wherein $\kappa$ is a relaxation rate of one of the oscillators, and $\kappa$ is less than the value of the nonlinear energy shift of the one of the oscillators divided by Planck's consta nt.

(Configuration 6) The device according to one of configurations 1 to 5, wherein
one of the oscillators includes:
a first resonator including a Josephson junction;
and a first electromagnetic wave application portion configured to apply an electromagnetic wave to the first resonator, and
the controller controls an oscillation of the first resonator by controlling the first electromagnetic wave application portion.

(Configuration 7) The device according to configuration 6, wherein the first electromagnetic wave application portion modulates flux inside a loop included in the first resonator.

(Configuration 8) The device according to configuration 6 or 7, wherein
the one of the oscillators includes a first conductive portion capacitively coupled to the first resonator, and
the controller controls the oscillation of the first resonator by controlling an electromagnetic wave propagating through the first conductive portion.

(Configuration 9) The device according to one of configurations 6 to 8, further comprising:
a second conductive portion; and
a second resonator including a Josephson junction,
a portion of the second conductive portion being coupled to the first resonator,
the second resonator being electrically connected to another portion of the second conductive portion.

(Configuration 10) The device according to configuration 9, further comprising a second electromagnetic wave application portion configured to apply an electromagnetic wave to the second resonator,
the controller being configured to control a relaxation rate of the one of the oscillators by controlling the second electromagnetic wave application portion.

(Configuration 11) The device according to one of configurations 1 to 10, further comprising a coupling resonator including an interconnect portion,
one of the oscillators and one other of the oscillators being coupled via the interconnect portion.

(Configuration 12) The device according to configuration 11, wherein the coupling resonator includes a Josephson junction provided between a ground potential and one end of the interconnect portion.

(Configuration 13) The device according to configuration 12, wherein
the coupling resonator further includes a third electromagnetic wave application portion configured to modulate flux inside a loop included in the coupling resonator, and
the controller controls coupling between the one of the oscillators and the one other of the oscillators by controlling the third electromagnetic wave application portion.

(Configuration 14) A sampling method implementing sampling processing by using an oscillator network including a plurality of oscillators coupled to each other,
each of the oscillators having a nonlinear energy shift,
the sampling processing including:
initialization processing of causing the oscillators to stop oscillating;
oscillation processing of causing the oscillators to oscillate based on a parameter relating to a first probability distribution; and
measurement processing of measuring, for the oscillators, a phase of an electromagnetic wave generated by the oscillation.

(Configuration 15) The method according to configuration 14, wherein $\kappa$, $T_s$, $n_{max}$, and $N_{spin}$ satisfy $\kappa > 1/(T_s \times n_{max} \times N_{spin})$, where $T_s$ is a time of one sampling processing, $n_{max}$ is a maximum value of an average number of photons of one of the oscillators within the time of the sampling processing, $\kappa$ is a relaxation rate of the one of the oscillators, and $N_{spin}$ is the number of the oscillators.

(Configuration 16) The method according to configuration 14 or 15, wherein $\kappa$ is a relaxation rate of one of the oscillators, and $\kappa$ is smaller than a Kerr coefficient of the one of the oscillators.

(Configuration 17) The method according to one of configuration 14 to 16, wherein
one of the oscillators includes:
a first resonator including a Josephson junction; and
a first electromagnetic wave application portion configured to apply an electromagnetic wave to the first resonator, and
an oscillation of the first resonator is controlled by controlling the first electromagnetic wave application portion.

(Configuration 18) The method according to configuration 17, wherein
a portion of a second conductive portion is coupled to the first resonator, and
a second resonator including a Josephson junction is electrically connected to another portion of the second conductive portion.

(Configuration 19) The method according to configuration 18, wherein
a second electromagnetic wave application portion applies an electromagnetic wave to the second resonator, and
the controller controls a relaxation rate of the one of the oscillators by controlling the second electromagnetic wave application portion.

(Configuration 20) The method according to one of configurations 14 to 19, further comprising processing of acquiring the parameter relating to the first probability distribution and acquiring the number of times the sampling processing is implemented.

(Configuration 21) The method according to one of configurations 14 to 20, further comprising processing of setting a parameter relating to the oscillation of the oscillators based on the parameter relating to the first probability distribution,
the oscillation processing being based on the parameter relating to the oscillation of the oscillators.

(Configuration 22) The method according to one of configurations 14 to 21, further comprising processing of outputting data based on a measurement result of a plurality of measurement processing.

According to the embodiments, a novel computing device and sampling method can be provided.

In the embodiment, the state of being electrically connected includes not only the state in which multiple conductors are in direct contact, but also the case where the multiple conductors are connected via another conductor. The state of being electrically connected includes the case where multiple conductors are connected via an element having a function such as switching, amplification, etc.

Hereinabove, embodiments of the invention are described with reference to specific examples. However, the invention is not limited to these specific examples. For example, one skilled in the art may similarly practice the invention by appropriately selecting specific configurations of components such as the oscillator, the oscillator network, the controller, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all computing devices and all sampling methods practicable by an appropriate design modification by one skilled in the art based on the computing devices and the sampling methods described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A computing device, comprising:
   an oscillator network including a plurality of oscillators coupled to each other; and
   a controller configured to control the oscillator network,
   each of the oscillators having a nonlinear energy shift, the controller performing a plurality of sampling operations, each sampling operation including:
      a first operation of outputting a signal causing the oscillators to stop oscillating,
      a second operation of outputting a signal causing the oscillators to oscillate based on a parameter relating to a first probability distribution, and
      a third operation of outputting a signal to measure, for the oscillators, a phase of an electromagnetic wave generated by an oscillation.

2. The device according to claim 1, wherein each of the oscillators is a resonator including a Josephson junction.

3. The device according to claim 1, wherein each of the oscillators includes a parameter modulation portion configured to cause the oscillator to oscillate by modulating a parameter of the oscillator.

4. The device according to claim 1, wherein $\kappa$, $T_s$, $n_{max}$, and $N_{spin}$ satisfy $\kappa > 1/(T_s \times n_{max} \times N_{spin})$, where $T_s$ is a time of one of the sampling operations, $n_{max}$ is a maximum value of an average number of photons of one of the oscillators within the time of the one sampling operation, $\kappa$ is a relaxation rate of the one of the oscillators, and $N_{spin}$ is the number of the oscillators.

5. The device according to claim 1, wherein $\kappa$ is a relaxation rate of one of the oscillators, and $\kappa$ is less than the value of the nonlinear energy shift of the one of the oscillators divided by Planck's constant.

6. The device according to claim 1, wherein
   one of the oscillators includes:
      a first resonator including a Josephson junction; and
      a first electromagnetic wave application portion configured to apply an electromagnetic wave to the first resonator, and
   the controller controls an oscillation of the first resonator by controlling the first electromagnetic wave application portion.

7. The device according to claim 6, wherein the first electromagnetic wave application portion modulates flux inside a loop included in the first resonator.

8. The device according to claim 6, wherein
   the one of the oscillators includes a first conductive portion capacitively coupled to the first resonator, and
   the controller controls the oscillation of the first resonator by controlling an electromagnetic wave propagating through the first conductive portion.

9. The device according to claim 6, further comprising:
   a second conductive portion; and
   a second resonator including a Josephson junction,
   a portion of the second conductive portion being coupled to the first resonator,
   the second resonator being electrically connected to another portion of the second conductive portion.

10. The device according to claim 9, further comprising a second electromagnetic wave application portion configured to apply an electromagnetic wave to the second resonator,
    the controller being configured to control a relaxation rate of the one of the oscillators by controlling the second electromagnetic wave application portion.

11. The device according to claim 1, further comprising a coupling resonator including an interconnect portion,
    one of the oscillators and one other of the oscillators being coupled via the interconnect portion.

12. The device according to claim 11, wherein the coupling resonator includes a Josephson junction provided between a ground potential and one end of the interconnect portion.

13. The device according to claim 12, wherein
    the coupling resonator further includes a third electromagnetic wave application portion configured to modulate flux inside a loop included in the coupling resonator, and
    the controller controls coupling between the one of the oscillators and the one other of the oscillators by controlling the third electromagnetic wave application portion.

14. A sampling method implementing sampling processing by using an oscillator network including a plurality of oscillators coupled to each other,
    each of the oscillators having a nonlinear energy shift,
    the sampling processing including:
       initialization processing of causing the oscillators to stop oscillating;
       oscillation processing of causing the oscillators to oscillate based on a parameter relating to a first probability distribution; and measurement processing of measuring, for the oscillators, a phase of an electromagnetic wave generated by the oscillation.

15. The method according to claim 14, wherein $\kappa$, $T_s$, $n_{max}$, and $N_{spin}$ satisfy $\kappa > 1/(T_s \times n_{max} \times N_{spin})$, where $T_s$ is a time of one sampling processing, $n_{max}$ is a maximum value of an average number of photons of one of the oscillators within the time of the sampling processing, $\kappa$ is a relaxation rate of the one of the oscillators, and $N_{spin}$ is the number of the oscillators.

16. The method according to claim 14, wherein $\kappa$ is a relaxation rate of one of the oscillators, and $\kappa$ is smaller than a Kerr coefficient of the one of the oscillators.

17. The method according to claim 14, wherein
one of the oscillators includes:
a first resonator including a Josephson junction; and
a first electromagnetic wave application portion configured to apply an electromagnetic wave to the first resonator, and
an oscillation of the first resonator is controlled by controlling the first electromagnetic wave application portion.

18. The method according to claim 14, further comprising processing of acquiring the parameter relating to the first probability distribution and acquiring the number of times the sampling processing is implemented.

19. The method according to claim 14, further comprising processing of setting a parameter relating to the oscillation of the oscillators based on the parameter relating to the first probability distribution,
the oscillation processing being based on the parameter relating to the oscillation of the oscillators.

20. The method according to claim 14, further comprising processing of outputting data based on a measurement result of a plurality of measurement processing.

* * * * *